US012720910B2

(12) United States Patent
Zrinscak

(10) Patent No.: US 12,720,910 B2
(45) Date of Patent: Aug. 25, 2026

(54) PROTECTION OF SPACE SOLAR CELLS IN AN ARRANGEMENT IN THE FORM OF A STRING

(71) Applicant: AZUR SPACE Solar Power GmbH, Heilbronn (DE)

(72) Inventor: Ivica Zrinscak, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 176 days.

(21) Appl. No.: 18/732,510

(22) Filed: Jun. 3, 2024

(65) Prior Publication Data

US 2024/0405137 A1 Dec. 5, 2024

(30) Foreign Application Priority Data

Jun. 1, 2023 (DE) .................... 10 2023 002 227.6

(51) Int. Cl.
*H10F 77/80* (2025.01)
*H10F 19/70* (2025.01)
*H10F 77/63* (2025.01)

(52) U.S. Cl.
CPC ............ *H10F 77/80* (2025.01); *H10F 19/70* (2025.01); *H10F 77/63* (2025.01)

(58) Field of Classification Search
CPC ........... H10F 77/80; H10F 77/63; H10F 19/70
See application file for complete search history.

(56) References Cited

U.S. PATENT DOCUMENTS

| | | | | |
|---|---|---|---|---|
| 2006/0225779 A1* | 10/2006 | Boulanger | H10F 77/955 | 136/244 |
| 2011/0067746 A1* | 3/2011 | Okubo | H10F 19/904 | 174/84 R |
| 2017/0170349 A1* | 6/2017 | Magnusdottir | H10F 77/937 | |
| 2018/0062011 A1* | 3/2018 | Crist | H10F 19/75 | |

* cited by examiner

*Primary Examiner* — Devina Pillay
(74) *Attorney, Agent, or Firm* — Muncy, Geissler, Olds & Lowe, P.C.

(57) ABSTRACT

A protection of space solar cells in an arrangement in the form of a string that extends in an X direction. In each case two space solar cells directly neighboring in the X direction are electrically connected to one another in series via a metallic connector of a first type. The string has a first end and a second end opposite from the first end, and a protection arrangement is provided directly at one of the two ends along a y direction. The protection arrangement includes a first string protection diode arrangement, a metal strip, and a second string protection diode arrangement provided in the Y direction. The protection arrangement is electrically connected to one of the two ends of the string via two spaced-apart metal strips, and each string protection diode arrangement includes multiple unhoused string protection diodes.

15 Claims, 6 Drawing Sheets

VB1
VB2
SD
WSZ
RR
DS1
DS2
DS3
BUB
K1
SA
D

Z

DGS
DGDS

DGDS

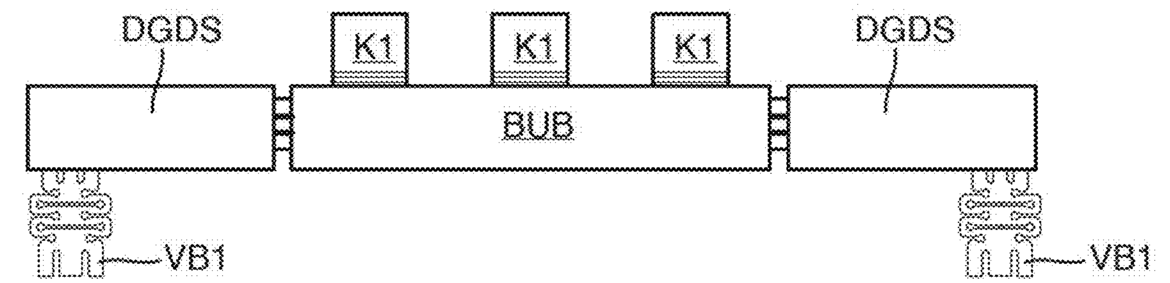
Fig. 3a
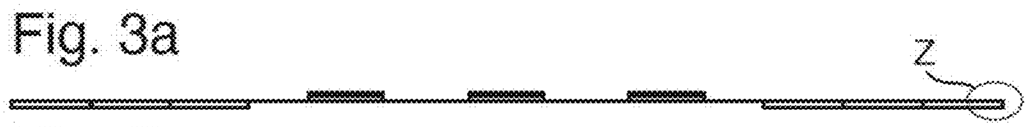
Fig. 3b
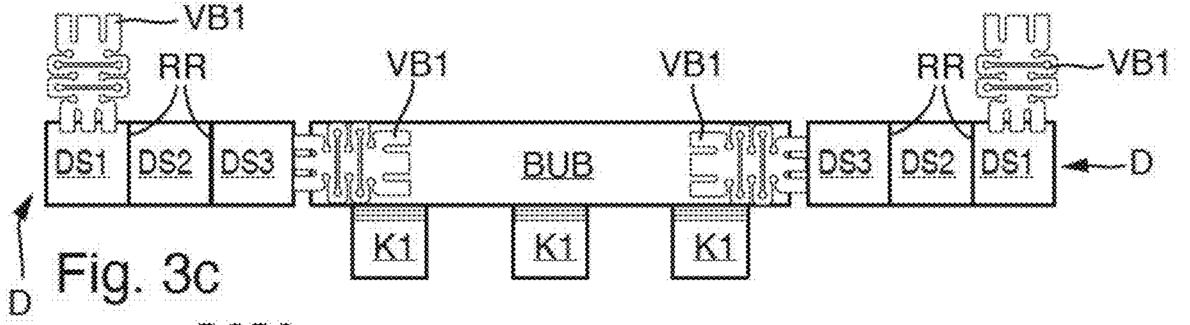
Fig. 3c
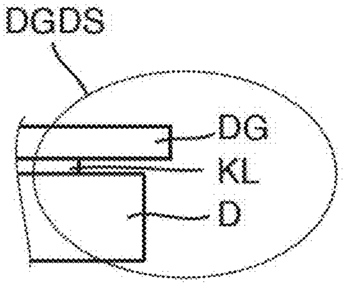
Fig. 3d
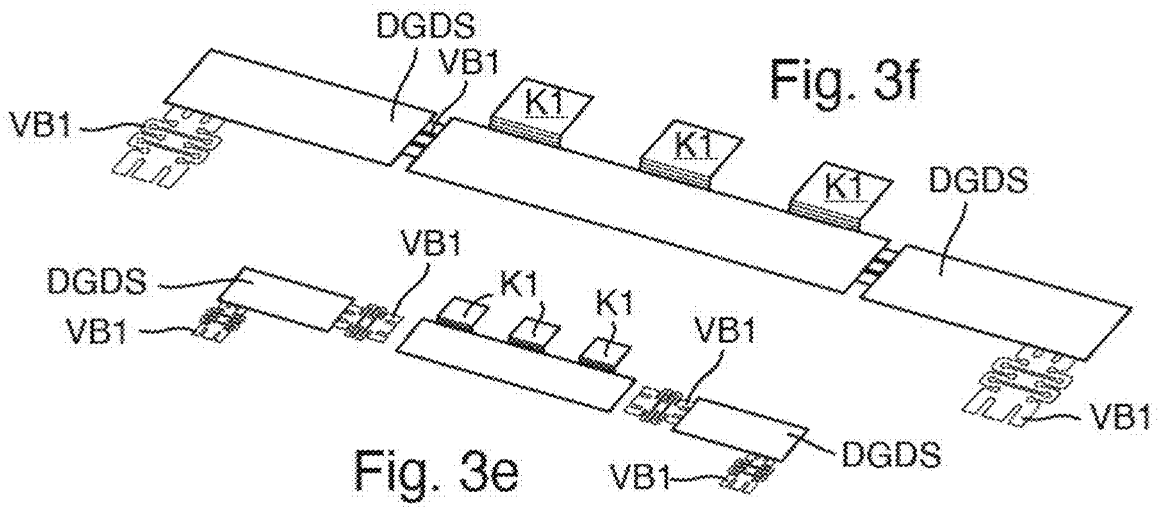
Fig. 3f
Fig. 3e
DGDS K1 K1 K1 DGDS
BUB
VB1 VB1
Z
VB1 VB1
RR VB1 VB1 RR
DS1 DS2 DS3 BUB DS3 DS2 DS1
D
K1 K1 K1
D
DGDS
DG
KL
D

PROTECTION OF SPACE SOLAR CELLS IN AN ARRANGEMENT IN THE FORM OF A STRING

This nonprovisional application claims priority under 35 U.S.C. § 119 (a) to German Patent Application No. 10 2023 002 227.6, which was filed in Germany on Jun. 1, 2023, and which is herein incorporated by reference.

BACKGROUND OF THE INVENTION

Field of the Invention

Solar cells for space applications are designed as so-called III-V multi-junction solar cells, i.e., with multiple p/n junctions connected in series, due to the requirements for high efficiency. At the present time, for this purpose at least three p/n junctions stacked one on top of the other are monolithically integrated. In the III-V multi-junction solar cells, the lowermost p/n junction is generally formed by a germanium substrate cell.

Description of the Background Art

In contrast to the solar cells for terrestrial applications, which are designed almost exclusively as single junction solar cells made of silicon in large rectangular modules having a rigid construction, totally different requirements are imposed on the designs of space solar cells. Important conditions for space solar cells include, among others, the lowest possible weight, an efficiency above 30%, very high reliability and robustness over the large temperature range, and resistance to vibrations and high levels of proton and electron radiation. Due to the fact that in the vacuum of space a release of heat, i.e., cooling of electrical components, is possible only in the form of radiation, heat dissipation of electrical components is significantly more complicated than for terrestrial applications.

Consequently, the manufacture and the construction technology for modules for space solar cells, i.e., the type of panels, has developed in a manner totally separate and different from the manufacture and the construction technology of terrestrial solar cell modules.

Thus, space solar cells, after they are thinned to a thickness less than 150 µm, are successively arranged in individual rows, also referred to as strings. The space solar cells are welded together along the string using specialized, likewise very lightweight and flexible, metal connectors and thus electrically connected in series. The rows are flexible along the longitudinal direction, and are situated on ultralight carbon fiber-reinforced rigid panels or on thin, flexible carrier films.

A panel generally comprises multiple strings. Multiple strings are connected to one another in series and/or parallel, on a panel on the rear side of the particular panel, via flexible cables. The panel on the rear side has a cable harness for this purpose. In addition, further electrical components are situated on the rear side of the panel.

In contrast to the above-mentioned designs for space solar cells, terrestrial solar cells are fixedly situated on a mechanically rigid, heavy, stable carrier plate and covered overall with a rigid, in particular hail-proof, glass plate. The glass plate for exactly one panel in each case is arranged on a circumferential frame, each panel having a design that is sealed from environmental influences by the frame and by use of adhesive, in particular silicone.

The total weight of a panel for terrestrial solar cells is higher than an ultralight panel of space solar cells by many orders of magnitude. Furthermore, defective panels are easily replaceable in terrestrial applications. Moreover, a panel of terrestrial solar cells therefore has only a few protective diodes.

In contrast, in the panels for space applications, each one of the space solar cells has its own bypass diode, so that in the event of failure of one space solar cell not all space solar cells of the particular string fail; i.e., the entire string does not fail.

In the space solar cell, the associated bypass diode is usually situated in one of the two "cropped corners." Each bypass diode is directly connected to the particular space solar cell via a metallic connector. The connectors are always welded for reliability reasons.

To protect the space solar cells from space radiation, the front sides of each of the space solar cells and the bypass diode situated in the corner are protected from shortwave UV light via a separate, very thin cover glass.

The ultrathin cover glasses each have a thickness of less than 0.2 mm, and are joined to the front side of the space solar cell by means of an adhesive. The bypass diodes situated in the cropped corner are covered by the cover glass of the associated space solar cells. In other words, the bypass diodes do not have their own, i.e., separate, cover glass.

A drawback of the above-mentioned arrangement is that when there is a defect in the pair made up of a space solar cell and the associated bypass diode, individual parts of a pair are replaceable only with great effort.

If the space solar cells are already situated on the string, replacing a defective part on the string is even more laborious, so that the entire string is defective, and as a whole is replaced by another string. In other words, repair or reworking is not economically feasible.

An arrangement of space solar cells is known from DE 10 2004 044 061 A1, which corresponds to US 2008/0000523. The space solar cells are designed in the form of a string. As stated above, each of the space solar cells has a bypass diode situated in the corner of the space solar cell, the bypass diode in each case being connected electrically antiparallel to the particular space solar cell and protected by the shared cover glass.

In addition to the respective bypass diodes, each string of space solar cells contains one or more string protection diodes that are housed or encapsulated, i.e., enclosed by molding compound. The task of the string protection diode is to suppress currents in a reverse direction compared to the normal operation, i.e., in a backward direction, in order to reduce current losses.

The string protection diodes are connected in series to the space solar cells of a string in a conducting direction, i.e., in a forward direction. In other words, during irradiation by the sun, the space solar cells situated on the string generate current of a few amperes, typically 1.5 A, and the entire current then flows through the string protection diode having a polarity in the forward direction.

In a backward direction, voltages of generally between 10 V and 100 V occur in particular when, for example, one of the multiple interconnected strings is exposed to little or no solar radiation, and one of the other strings is exposed to full solar radiation. A current flow through the strings in darkness is suppressed by the string protection diode, which now has a polarity in the backward direction.

For reasons of reliability and flexibility, for designs that are present in the application, for each string one or more housed string protection diodes are situated on the rear side of the panel, and are connected to the string on the front side of the panel via flexible electrical lines. Due to the arrangement, the housed string protection diodes on the rear side of the panel are protected from additional heat input from the sun, so that the heat dissipation under a fairly high current load is not problematic.

It is noted that due to the lack of convection in space, passive cooling takes place only in the form of radiant heat; at the maximum allowable temperatures of less than or equal to 170° C. for the string protection diodes, which are generally designed as Si diodes, only a small amount of energy can be radiated.

For redundancy reasons and/or to reduce the generation of heat, multiple string protection diodes are often connected in parallel.

An integrated arrangement of string protection diodes situated on the front side is known from US 2018/0062011 A1, in particular FIGS. 3*a*, 3*b*, 4*a*, and 4*b* thereof. For each string, one or more string protection diodes at the end of each string are integrated into a second corner of the space solar cell situated at the end of the string, similarly as for the integrated arrangement of the bypass diode. In the space solar cell, the second corner and the first corner are situated on the same side.

A rear side or a front side of the string protection diode is electrically connected in series to the rear side or the front side of the directly neighboring space solar cell via a further metallic connector. A second contact is formed at the top side of the string protection diode. The second contact is connected to a continuous rectangular metallic contact part at the end of the space solar cell string via a further connector. Corresponding to the bypass diode, the string protection diode is also adhesively bonded to the cover glass of the directly neighboring space solar cell.

The string protection diode, as stated above, is integrated with the particular space solar cell, corresponding to the bypass diode; i.e., the string protection diode together with the space solar cell is situated on a plastic carrier film or on the panel.

As a result, the fabrication of strings is much more complicated, since in particular the string protection diodes, compared to the bypass diodes, must have a significantly larger and more powerful design in order to tolerate the current load of the entire string in the forward direction with as little electrical loss as possible.

In other words, the room in the corners of the space solar cells is very limited. It has also been shown that a triangular design is not practicable due to the additional effort in sawing the protection diodes from the Si manufacturing substrate.

Furthermore, the irradiation from the sun in space is much more intense than on the earth. Cooling the string protection diodes under the intense solar radiation, in particular in the operating mode in which high currents flow through the string protection diodes, is often not sufficient. If the temperature at the Si string protection diodes increases to the vicinity of 150° C., the electrical power loss at the string protection diodes additionally increases, which may result in a failure.

Moreover, it is known to those skilled in the art that the reject rate in the string fabrication also increases. Precisely because of the high integration level, repair, i.e., reworking in the event of defects in the connection of the string protection diode to the space solar cell or for defects in the protective diodes, is not feasible for economic reasons and also due to the stringent requirements for reliability.

On account of the stated drawbacks for an integrated arrangement on the front side of the panel, the above-described discrete arrangement of the string protection diodes on the rear side of the panels, using flexible cables, is utilized for manufacturing space solar panels.

Such an embodiment is illustrated in FIG. 5. A detail of a rear side of a panel for space applications is shown. The individual strings provided on the front side of the panel are each connected on circuit boards PLT via a plurality of flexible cables ELK on the rear side. The plurality of cables ELK are combined in the form of cable harnesses KB. Individual housed string protection diodes SSD are situated on the larger circuit boards PLT.

It is understood that a customary design illustrated in FIG. 5 requires a certain amount of effort and results in some additional weight.

SUMMARY OF THE INVENTION

It is therefore an object of the invention to provide a device that refines the prior art.

In the subject matter of the present invention, an arrangement for protecting space solar cells is provided, at least a portion of the space solar cells being arranged in rows in the form of a string along an X direction.

Strings having a longer design in the X direction, in particular due to the geometric requirements of the panels, may also be arranged in multiple, in particular adjacently situated, rows and connected in series.

The string can include at least two space solar cells situated in succession, the directly neighboring space solar cells along the X direction being electrically connected to one another in series via one or more metallic connectors.

The space solar cells each have a receiving surface that can be provided in an X direction and in a Y direction.

In addition, the string has a front side and a rear side, the receiving surfaces of the space solar cells being provided on the front side of the string.

Furthermore, the string has a first end and a second end, the two ends each extending in the y direction along a side of the space solar cell situated at the ends of the string.

The two ends of the string may be situated opposite one another along a straight line that is formed toward the Y direction.

Each space solar cell may have a bypass diode that is connected to the particular space solar cell, the space solar cells each having a thickness between 30 μm and 300 μm or a thickness between 50 μm and 160 μm in a Z direction.

Furthermore, on the front side a protection arrangement is provided at at least one of the two ends along the y direction, the protection arrangement being electrically connected to the space solar cell, situated at the end of the string, via one of the metallic connectors.

The protection arrangement can include a first string protection diode arrangement, a metal strip, and a second string protection diode arrangement. The metal strip has a first head-side end, a spacer, and a second head-side end.

The first string protection diode arrangement can be connected in series to the first head-side end of the metal strip in the y direction via one of the metallic connectors.

In addition, the second string protection diode arrangement can be connected in series to the second head-side end of the metal strip in the y direction via one of the metallic connectors.

The connectors each have two contact surfaces that are spaced apart by a connecting piece.

The string protection diode arrangements have multiple string protection diodes that are designed as part of a DIE, the DIE having a top side and a bottom side.

The string protection diodes situated on the DIE can be arranged in rows and/or in columns.

On the top side of the DIE, in each case two directly neighboring string protection diodes can be separated by a scribe line region, and have electrically separated front side contacts.

The rear side of the DIE is metal-plated, so that multiple or all string protection diodes have a shared rear side contact.

The shared rear side contact can be connected to the metal strip or to the space solar cell situated at the ends of the string.

One of the front side contacts of the string protection diodes can be connected to one of the space solar cells situated at the ends of the string, or to the metal strip.

It is understood that each DIE can be unhoused. In other words, the DIE is a semiconductor component that is not covered with a molding compound or some other plastic compound.

In addition, each DIE on the top side can have its own, i.e., separate, cover, the cover being adhesively bonded to the top side of the DIE. The cover is not provided until an assembly step in conjunction with the fabrication of a string. It is understood that the cover can have a flat, transparent design. The cover may be situated only on the top side of the DIE.

Moreover, the protection arrangement as a whole can have a flat design, and has a thickness less than 1 mm in a Z direction.

The extension of the overall protection arrangement in the Y direction can be greater than the extension in the X direction by at least a factor of five.

It has surprisingly been shown that integration of the string protection diodes by use of the present arrangement on the front side of the string is extremely advantageous.

In particular, an advantage of the protection arrangement is that the complexity of the wiring on the rear side of the string or of the panel is significantly reduced.

In addition, due to the advantageous configuration of the two string protection arrangements in conjunction with the metal strip, in the event of a manufacturing defect the individual DIE may be replaced without mechanically affecting the string.

Another advantage is that each DIE can have a plurality of individual string protection diodes, for each DIE only one of the string protection diodes being connected by selecting one of the string protection diodes by means of the top side connection.

It has also been shown that due to the advantageous integration of the string protection diode arrangement in conjunction with the metal strip, the manufacturing costs may be reduced and the reliability may be increased.

As a result of the particular DIE of the string protection diode arrangement having a large metal-plated rear side contact surface, and the rear side contact surface being directly connected to the metal strip or directly connected to the metal strip via a large-surface connector, the DIEs and thus the string protection diode arrangements do not overheat, even at maximum power and under direct irradiation from the sun. In other words, a large quantity of heat may be radiated into space via the large metal-plated rear side face of the DIE.

In addition to the good thermal coupling, the high degree of reflection from the metal surface on the top side of the DIE is also important for this purpose. The top sides of the individual string protection diodes have virtually full-surface metal plating due to the front side contacts. The overall degree of reflection of the arrangement in the visible and infrared range is preferably above 80% or above 90%. It is advantageous when the cover layer for infrared radiation is permeable, i.e., transparent, in order to dissipate the heat from the string protection diodes via the radiation in the infrared range.

The respective top sides of the string protection diodes can have a metallic layer that covers more than 60% of the surface in order to reflect the solar radiation or to satisfactorily radiate the heat from the component.

The distance in the X direction between the space solar cell situated at the end of the string and the protection arrangement can be in a range of 0.01 mm to 2.0 mm or in a range of 0.1 mm to 1 mm or in a range of 0.2 mm to 0.5 mm.

Furthermore, the receiving surface of the space solar cell in each case can be between 4 $cm^2$ and 500 $cm^2$ or between 30 $cm^2$ and 350 $cm^2$ or between 70 $cm^2$ and 160 $cm^2$.

It is noted that the term “metallic connector” can be understood to mean a connector that includes or is made of a metal. In particular, a metallic connector also has a multilayer construction made up, for example, of one or more organic carrier layers or multiple metal layers and at least one organic carrier layer, or multiple different metal layers and one or more organic carrier layers.

It is understood that the term “connected” can be intended to mean an electrical connection.

The electrical connection between the particular contacted string protection diode and the first contact surface of the connector, and/or the electrical connection between the second contact surface and the metal strip or the space solar cell, in each case can have/has an integrally joined design.

The contact resistance in the electrical connection can be less than 10 ohms or less than 5 ohms or less than 1 ohms.

As the result of a string containing a fairly large number of space solar cells, the electrical power data of the string protection diode can be be adapted to the electrical data of the space solar cell string. In other words, the current carrying capacity of the string protection diodes is at least 50% higher than the maximum current of the string under full solar radiation, and is generally a few amperes.

The current carrying capacity of the individual string protection diode can be in a range between 100 mA and 10 A or between 1 A and 5 A.

In the string protection diode arrangement, the DIE can be made of silicon or GaAs. In other words, the DIE includes a silicon or GaAs substrate with a shared rear-side metal plating, and on the front side, separate string protection diodes that are formed in each case by the scribe line.

An advantage of GaAs compared to silicon (Si) is that the voltage drop in the forward direction is less.

Kovar material can be used as a connector and/or as a metal strip.

The connector and/or the metal strip can contain more than 50% iron, preferably more than 20% cobalt, and preferably more than 10% nickel.

An Invar connector can be used as a connector.

The connector and/or the metal strip can includes or is made of pure silver and/or includes molybdenum, the molybdenum preferably being coated with silver on one or both sides.

To establish a reliable electrical and mechanical connection, the connectors can have metal tabs. In particular, the metal tabs can be designed for welding processes.

The connectors of the protection arrangement can be precisely welded multiple times (i.e., between two and six times) to one end of the string. It is understood that the weld points in each case can be spaced apart from one another in the Y direction.

At exactly two contact points spaced apart from one another in the y direction, the contact surfaces or the contact tabs of the connectors at one end of the string can be welded to the space solar cell and/or the bypass diode situated at the end.

The distance between the two contact points in the y direction can be a multiple of the distance from the particular contact point to the edge of the space solar cell that is formed along the x direction.

In other words, the two weld points for the connection to the string protection diodes can be situated in the vicinity of the particular outer edge of the string that is formed in the x direction.

Each of the string protection diodes can comprise at least two string protection diodes that are electrically connected to one another in parallel. In the x direction, the two string protection diodes connected in parallel are preferably situated in parallel and spaced apart from one another in the Y direction. An advantage is that, as a result of the parallel connection, simple redundancy is provided if there is a failure of one of the string protection diodes.

For each string exactly four string protection diodes can be provided, i.e., connected to the string. In each case two of the string protection diodes can be connected in series and form two mutually parallel branches, the two nodes of the branches being directly connected to one another, i.e., short-circuited to one another.

Despite the slightly higher resistance of the series connection in the forward direction, one advantage is that due to the increased, i.e., more than twofold, redundancy, one or more string protection diodes are still protected in the backward direction, even if more than one string protection diode of the particular string fails.

Two string protection diodes that are connected in parallel can be provided at both ends. A series connection of the string protection diode and the space solar cells of the string or of the bypass diodes and the string protection diode is thus formed.

An advantage is that due to the greater than twofold redundancy, the fail-safe operation can be further increased compared to the embodiment with only two string protection diodes. Among one another, the string protection diodes can have the same electrical data, or in a first approximation, virtually the same electrical data.

Two string protection diodes connected to one another in series can be provided instead of a single string protection diode. In one refinement, one or both of the string protection diodes connected in series are formed from a combination of string protection diodes connected in series and in parallel. One advantage is that with the serial connection, a higher reverse voltage may be easily achieved in the backward direction.

The string protection diode can be formed from silicon or GaAs.

The string protection diode can have a reverse voltage range between 10 V and 1000 V or between 30 V and 600 V or between 80 V and 300 V or between 10 V and 300 V.

The string protection diode can have a current range between 0.1 A and 5 A or between 0.5 A and 2 A.

Exclusively III-V multi-junction space solar cells can be situated on the string as a space solar cell.

At least two and at most twenty III-V multi-junction space solar cells can be electrically connected in series on a string.

The serial connection of the space solar cells can comprise or is made up of five space solar cells or ten space solar cells or twenty space solar cells.

The serial connection can comprise or is made up overall of at most forty or at most one hundred space solar cells connected in series.

The serially connected space solar cells can be distributed over at least two or three strings. The serially connected space solar cells can be distributed over at most ten strings.

A string, also referred to below as an overall string, can be divided into multiple directly adjoining parts, the parts being connected to one another in series, and the first end then no longer being situated opposite the second end in the X direction. It is understood that the two parts can be situated in parallel and spaced apart from one another in the Y direction. It is also noted that the two parts of the overall string have equal lengths or unequal lengths.

The receiving surfaces of the space solar cells can be formed exclusively in parallel to the X direction and in parallel to the Y direction. In other words, the receiving surfaces preferably lie in an X-Y plane.

The connectors can have a first contact surface and a second contact surface, one of the two contact surfaces being connected to the full-surface metal contact at the bottom side, or to one of the metal contacts at the top side, of one of the string protection diodes, and the other of the two contact surfaces being connected to the metal strip.

For the connectors the two contact surfaces can have the same or different designs. For the connectors at least one of the contact surfaces or both contact surfaces can have a contact tab or multiple contact tabs, respectively.

The connecting piece between the two contact surfaces can have a meandering design, at least for a portion of the connectors, in order to mechanically decouple the two contact surfaces from one another.

The term "meandering" clarifies that for the connectors, the connecting piece has a larger extension, transverse to a straight line that connects the two contact surfaces, than in the direction of the straight line, and transverse to the direction of the straight line optionally has multiple protrusions and recesses.

In other words, in some of the connectors the connecting piece can resemble the shape of a meander.

The two contact surfaces of the connectors can each have a flat design, and have a thickness between 0.01 mm and 0.7 mm in the Z direction. The thickness of the contact surfaces is preferably constant over the extension.

The connectors can have a rectangular area, the long side of the rectangular area having an extension that is larger than the short side by at least a factor of 5.

All space solar cells of the string each can have a bypass diode, the bypass diode being directly connected to the particular space solar cell.

In an example, one of the string protection diodes of one of the two string protection arrangements formed at one end of the string can be directly connected to the bypass diode of the space solar cell situated at one of the two ends.

A protection arrangement can be provided at both ends of the string. An advantage is that the redundancy is thus increased.

When light strikes the front side of the space solar cells, the current flows exclusively through the respective contacted string protection diode and the metal strip to the connection line.

The contact tabs can have a thickness between 0.01 mm and 0.5 mm or between 0.02 mm and 0.2 mm.

The cover of the DIE has high transmission in the infrared range or is transparent in the infrared range, in order to reflect the heat radiation or in order to not suppress the radiation of heat from the string protection diode.

The protection arrangement can be provided directly at one of the two ends, the distance in the X direction between the protection arrangement and the space solar cell that is connected to the protection arrangement being in a range between 10 μm and 10 mm or in a range between 100 μm and 2 mm.

Cooling for the string protection diodes or the DIE can be provided by the metal strip and/or the connection line and/or the metal-plated bottom side of the DIEs.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 3*a* to 3*f* show various detailed views of the protection arrangement and of the connectors together with a string protection diode arrangement.

DETAILED DESCRIPTION

Figure 1A:
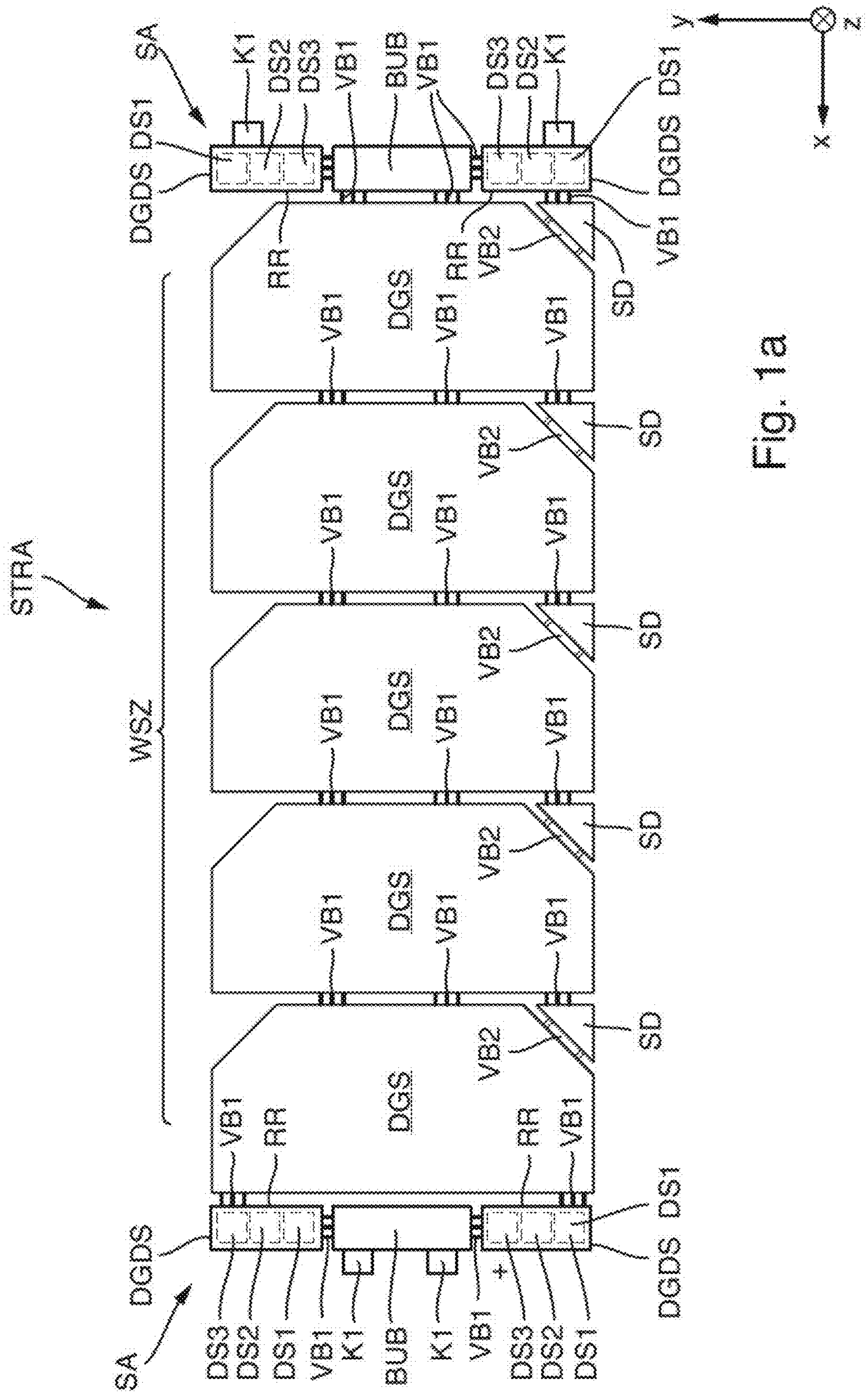
FIGS. 1*a* and 1*b* show various designs of a string of space solar cells with a protection arrangement, provided at both ends, which is connected in each case to one of the space solar cells situated at the respective end.
Figure 1B:
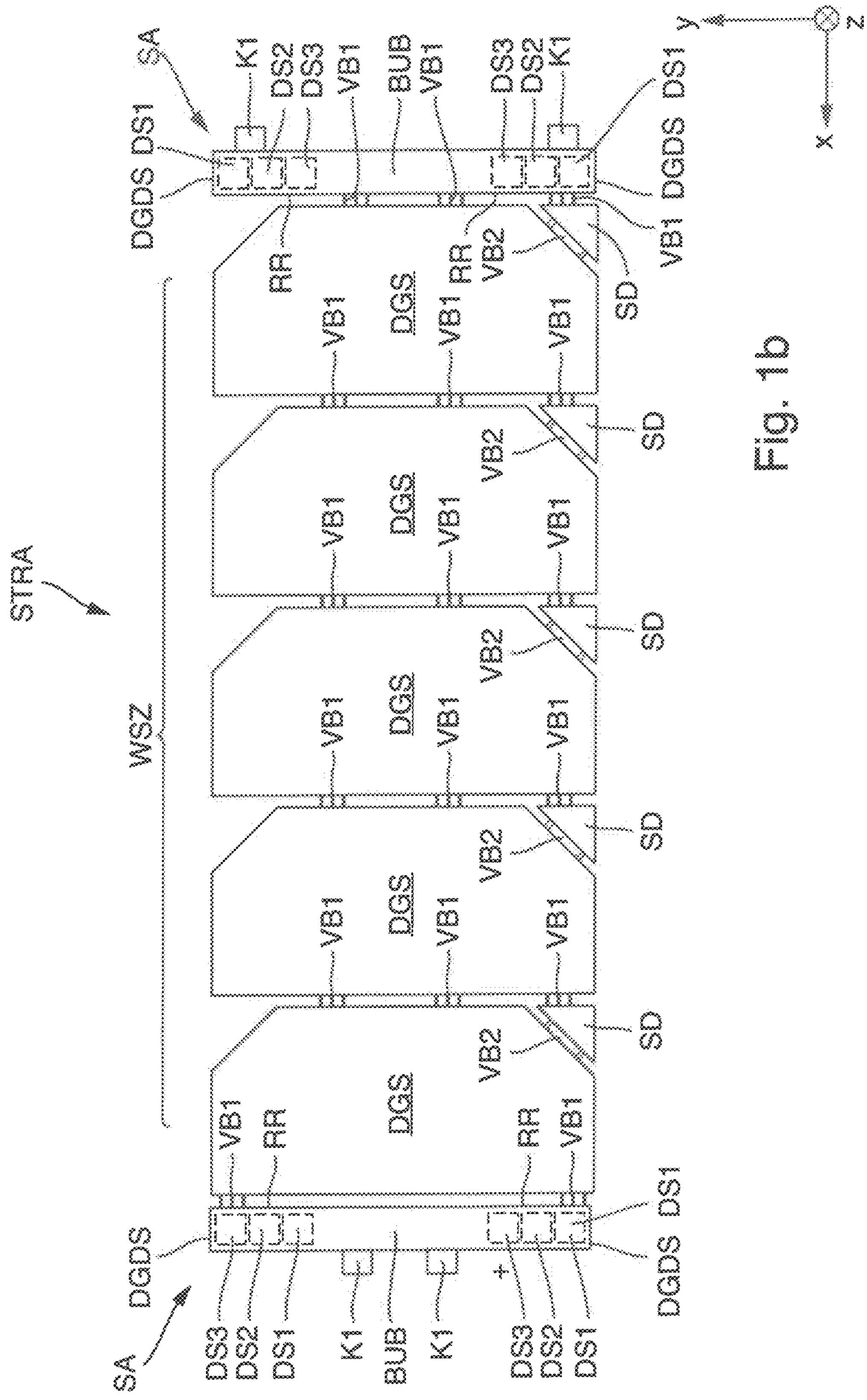

The illustrations in FIGS. 1*a* and 1*b* show various designs of a string STRA of space solar cells WSZ with a protection arrangement SA that is provided at both ends, the particular protection arrangement SA being connected to one of the space solar cells WSZ situated at the respective end.

The protection arrangement SA has a flat design overall, and has a thickness less than 1 mm in a Z direction.

The extension of the overall protection arrangement SA in the Y direction is greater than the extension in the X direction by at least a factor of five.

One of the two ends of the protection arrangement SA is designed as a positive voltage pole (+), and the other end is designed as a negative voltage pole (−).

However, it should be understood that only one protection arrangement SA can be provided, either at the end with the positive voltage pole (+) or at the end with the negative voltage pole (−).

In the present case, the space solar cells WSZ are arranged in succession in the form of the string STRA extending in an X direction, the string STRA including a total of five space solar cells WSZ. Each of the five space solar cells WSZ is protected by its own cover glass DGS on a top side.

In each case, two space solar cells WSZ directly neighboring one another in the X direction are electrically connected to one another in series via exactly two metallic connectors VB1.

The space solar cells WSZ have a receiving surface situated in each case in an X direction and in a Y direction.

The string STRA has a front side and a rear side, the front side being illustrated in the depicted top view.

In the present case, the receiving surfaces of the space solar cells WSZ are provided on the front side of the string STRA.

The string STRA has a first end and a second end opposite the first end, the two ends each extending in the y direction along one side of the space solar cell WSZ situated at the ends of the string.

In the present case, each of the space solar cells WSZ has a bypass diode SD that is connected to the particular space solar cell WSZ. The bypass diodes SD are each situated in a corner of the associated space solar cell WSZ, and via two connectors VB1, VB2 are connected to the space solar cell WSZ directly neighboring in the X direction and to the space solar cell WSZ directly neighboring in the Y direction.

It is understood that the bypass diode SD and the associated space solar cell WSZ in the X direction can be covered by a single cover glass DGS.

The space solar cells WSZ each have a thickness between 30 μm and 300 μm or a thickness between 50 μm and 160 μm in a Z direction.

The protection arrangements SA situated on the front side of the string STRA are in each case provided along the y direction.

The protection arrangements SA are electrically connected to the space solar cells WSZ of the string STRA, situated at the two ends, via multiple metallic connectors.

The protection arrangement SA includes a first string protection diode arrangement DGDS, a metal strip BUB, and a second string protection diode arrangement DGDS. In addition, contact tabs with contact surfaces K1 are preferably formed at the metal strip; the contact tabs and the metal strip generally have a one-piece design.

The metal strip BUB has a first head-side end, a spacer, and a second head-side end.

In the example illustrated in FIG. 1*a*, also referred to as the first alternative, in the y direction the first string protection diode arrangement DGDS is connected in series to the first head-side end of the metal strip BUB via one of the metallic connectors VB1.

Furthermore, the second string protection diode arrangement DGDS is connected in series, likewise in the y direction, to the second head-side end of the metal strip BUB via one of the metallic connectors VB1.

Each of the two string protection diode arrangements DGDS has a first string protection diode DS1, a second string protection diode DS2, and a third string protection diode DS3. The string protection diodes DS1 through DS3 are arranged together on a DIE D, in each case two directly neighboring string protection diodes DS1 through DS3 being electrically separated from one another on the top side of the DIE D by a scribe line RR. In the present case, the string protection diodes DS1 through DS3 are arranged in a row in each case.

The connectors VB1 each have two contact surfaces that are spaced apart from one another by a connecting piece.

In the protection arrangement SA, connected to the end at which the positive potential (+) is present, the two string protection diode arrangements DGDS are each connected to the space solar cell WSZ via one of the connectors VB1 provided in the X direction. In other words, the two branches of the string protection diode arrangements DGDS are parallel to one another and thus create redundancy.

The metal strip BUB has two contact tabs K1, one each for connecting a flexible cable.

It is noted that for each of the two branches, the flexible cable is connected in series, via the contact tabs K1, to the metal strip BUB, to the string protection diode arrangements DGDS, and to the space solar cell WSZ.

In the protection arrangement SA, connected to the end at which the negative potential (−) is present, the two electrically contacted string protection diodes DS1 through DS3 of the string protection diode arrangements DGDS are each connected in the negative X direction, via one of the connectors VB1, to a flexible cable by means of one of the respective contact tabs K1.

In addition, one of the string protection diodes DS1 through DS3 of the DIE D from one of the string protection diode arrangements DGDS is connected to the bypass diode of the space solar cell WSZ via one of the connectors VB1. In the present case, the metal strip BUB is connected, via two other of the connectors VB1, to the space solar cell WSZ provided at the end of the string STRA.

In addition, the contacted string protection diode DS1 through DS3 of the first string protection diode arrangement DGDS and the contacted string protection diode DS1 through DS3 of the second string protection diode arrangement DGDS are connected in series, likewise in the y direction, to the first or to the second head-side end of the metal strip BUB via one of the metallic connectors VB1.

Here as well, the two branches of the string protection diode arrangements DGDS are connected to one another in parallel, thus creating redundancy.

It is noted that for each of the two branches, the space solar cells WSZ are connected in series, via the metal strip BUB, to the string protection diode arrangements DGDS and to the flexible connecting cables.

In the embodiment illustrated in FIG. 1*b*, also referred to as the second alternative, only the differences from the embodiment stated in conjunction with the drawing of FIG. 1*a* are explained.

At the first head-side end, at which the positive potential (+) is present, the first string protection diode arrangement DGDS is situated directly on the metal strip BUB without a connector VB1. Two connectors VB1 may thus be saved, compared to the embodiment illustrated in FIG. 1*a*.

Furthermore, at the second head-side end the second string protection diode arrangement DGDS is situated directly on the metal strip BUB.

In the two alternatives illustrated in FIG. 1*a* or FIG. 1*b*, in the X direction the two string protection diode arrangements DGDS are each electrically connected in series, via one of the metallic connectors VB1, to the space solar cell WSZ situated at the end of the string STRA.

It is noted that in the present case, the string protection diode arrangements DGDS each have their own cover in the form of a cover glass. It is understood that the cover can be in each case adhesively bonded to the individual string protection diode arrangements DGDS.

The illustrations in FIGS. 2*a* through 2*e* show detailed views of, among other things, the front side, the lateral side, and the rear side of the protection arrangement SA which is connected to a space solar cell WSZ.

Figures 2A, 2B, 2C, 2D, 2E:
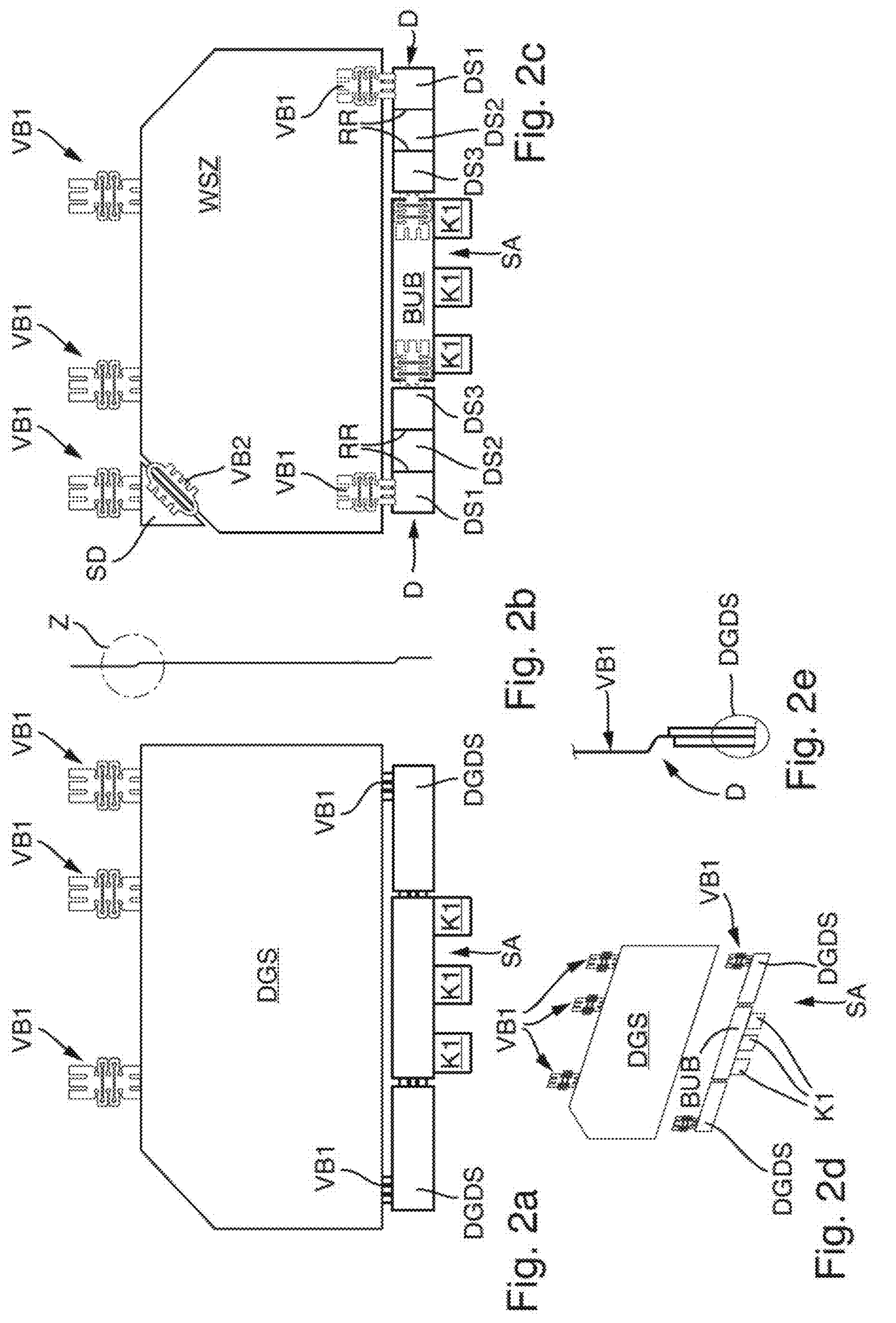
FIGS. 2*a* to 2*e* illustrate detailed views of, among other things, the front side, the lateral side, and the rear side of the protection arrangement which is connected to a space solar cell.

In particular, FIG. 2*b* shows a side view, FIG. 2*c* shows a top view of the rear side, and FIG. 2*c* shows a perspective view of the arrangement in FIG. 2*a*.

FIG. 2*e* shows a portion of a detailed side view of a string protection diode arrangement DGDS.

Only the differences from the preceding embodiments are explained below.

FIG. 2*a* shows the top view of the front side of one of the space solar cells WSZ, which is covered by a cover glass DGS. At one of the two ends, which are an edge of the space solar cell WSZ formed in the Y direction for the serial connection to an adjacent space solar cell WSZ, the contact tabs of a total of three of the connectors VB1 are visible.

The connectors VB1 have a first contact surface and a second contact surface. In each case, one of the two contact surfaces of the three connectors is welded to the top side of the space solar cell WSZ. The other contact surface is provided for connection to a further space solar cell WSZ. In the present case the two contact surfaces have an identical design.

Both contact surfaces have multiple contact tabs. The respective connecting pieces between each of the two contact surfaces of the connectors VB1 have a meandering design in order to mechanically decouple the respective two contact surfaces from one another.

At the opposite, long edge of the space solar cell WSZ, the protection arrangement SA is provided in each case with the two string protection diode arrangements DGDS, protected in each case by a cover glass designed as a cover layer, and the metal strip BUB. It is understood that the cover glass can be transparent in the infrared range in order to emit heat radiation into space.

A total of three contact tabs K1 are provided at the metal strip BUB for connection of the flexible cables.

The side view in FIG. 2*b* shows the small thickness of the string STRA, which is less than one millimeter. In addition, a step is formed between the metal strip BUB and the contact tabs K1.

It is apparent from the rear side view in FIG. 2*c* that the bypass diode SD is connected to the bottom side of the space solar cell WSZ via a wide connector VB2. Furthermore, the protection arrangements SA are connected to the opposite edge via the contact surfaces of the connectors VB1. In addition, the DIE D with the three string protection diodes DS1 through DS3 is illustrated at both ends of the metal strip. In each case, only the first string protection diode DS1 is connected to the string STRA.

It is apparent from the illustration in FIG. 2*e* that one of the two contact surfaces of the connector VB1 is connected to the top side of the DIE D and is covered by the cover glass. In addition, the connector VB1 has a step between the two contact surfaces.

FIGS. 3*a* through 3*f* illustrate detailed views of the protection arrangement SA, the connectors VB1, and the design of the string protection diodes DGDS. Only the differences from the preceding figures are explained below.

It is shown that the contact surfaces of the connectors VB1 each have exactly three contact tabs. In addition, in the side view in FIG. 3*b* it is shown that the protection arrangement SA has a very thin design in the Z direction, and preferably has a thickness less than 1 mm.

The enlarged detail in FIG. 3*d* shows that on one side of the string protection diode DGDS, a cover glass DG is situated on the top side of the DIE D by use of an adhesive KL.

Figure 4:
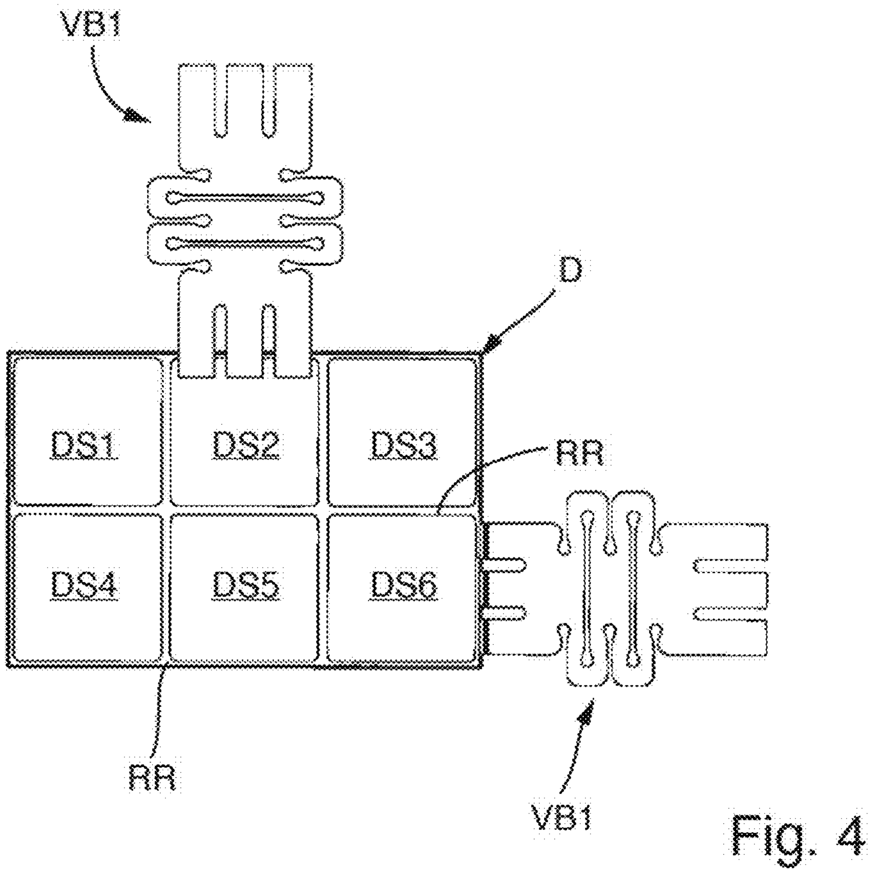
FIG. 4 shows a top view of the top side of a DIE with multiple string protection diodes that are electrically separated by means of a scribe line.
Figure 5:
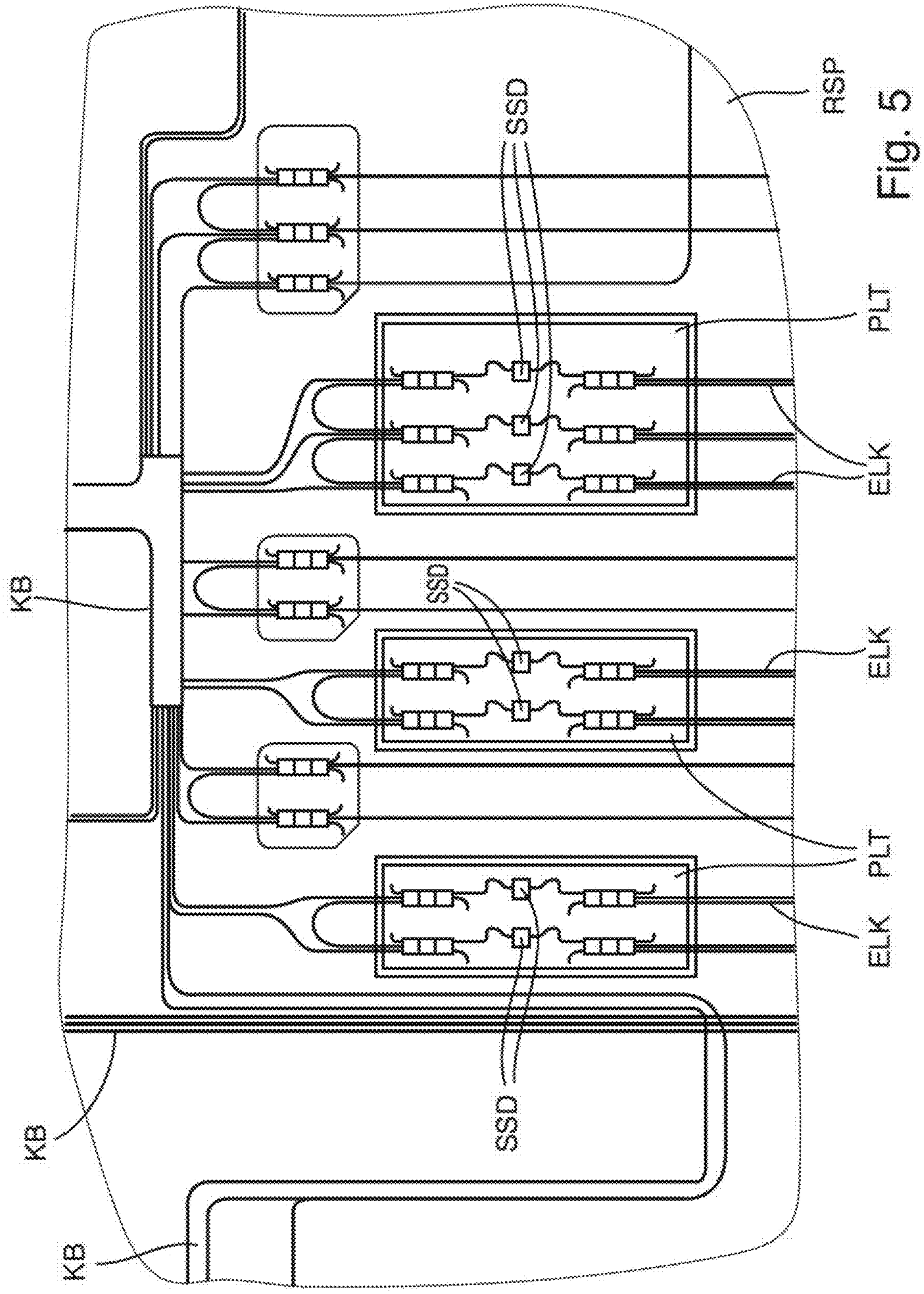
FIG. 5 shows a top view of one discrete example of string protection diodes on the rear side of a panel according to the conventional art.

The illustration in FIG. 4 shows a top view of the top side of a DIE D with multiple string protection diodes DS1 through DS6, which are electrically separated by means of the scribe line RR.

In contrast to the preceding arrangements, the DIE D now contains a total of six string protection diodes DS1 through DS6, the string protection diodes DS1 through DS6 being arranged in two rows. The DIE has a rectangular shape.

The bottom side may be metal-plated over the entire surface and is contacted via one of the connectors VB1. At the top side, only the second string protection diode DS2 is contacted via one of the connectors VB1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A protection of an arrangement comprising space solar cells arranged in the form of a string, wherein:

at least a portion of the arrangement of space solar cells being arranged in succession in the form of the string, which extends in an X direction, the string includes at least two space solar cells, in each case two space solar cells directly neighboring in the X direction are electrically connected to one another in series via one or more metallic connectors, the space solar cells each have a receiving surface that is situated in an X direction and in a Y direction, the string has a front side and a rear side, the receiving surfaces of the space solar cells being provided on the front side of the string, the string has a first end and a second end, the two ends each extending in the Y direction along a side of the space solar cell arranged at the ends of the string, each space solar cell has a bypass diode that is connected to the respective space solar cell, the space solar cells each have a thickness between 30 μm and 300 μm or a thickness between 50 μm and 160 μm in a Z direction, on the front side of the string a protection arrangement is provided at at least one of the two ends along the Y direction, and the protection arrangement is electrically connected to the space solar cell of the string, situated at the end, via one of the metallic connectors, the protection arrangement including a first string protection diode arrangement, a metal strip, and a second string protection diode arrangement, the metal strip has a first head-side end, a spacer, and a second head-side end, the first string protection diode arrangement is connected in series to the first head-side end of the metal strip in the Y direction via one of the metallic connectors, the second string protection diode arrangement is connected in series to the second head-side end of the metal strip via one of the metallic connectors, the connectors each have two contact surfaces that are spaced apart by a connecting piece, the string protection diode arrangements have multiple string protection diodes that are designed as part of a DIE, the DIE having a top side and a bottom side, the string protection diodes situated on the DIE are arranged in rows and/or in columns, on the top side of the DIE, two directly neighboring string protection diodes are separated by a scribe line region, and have electrically separated front side contacts, and the rear side of the DIE is metal-plated, so that multiple or all string protection diodes have a shared rear side contact, the shared rear side contact is connected to the metal strip or to the space solar cell arranged at the ends of the string, and one of the front side contacts of the string protection diodes is connected to one of the space solar cells situated at the ends of the string or to the metal strip, each DIE is unhoused, and on the top side has its own cover, the cover being adhesively bonded to the top side of the DIE, the protective arrangement as a whole has a flat design, and has a thickness less than 1 mm in a Z direction, and an extension of the overall protection arrangement in the Y direction is greater than an extension in the X direction by at least a factor of five.

2. The protection of an arrangement of space solar cells according to claim 1, wherein the two contact surfaces include a first contact surface and a second contact surface, one of the two contact surfaces being connected to the metal contact at the bottom side, or to one of the metal contacts at the top side, of one of the string protection diodes, and the other of the two contact surfaces being connected to the metal strip.

3. The protection of an arrangement of space solar cells according to claim 1, wherein for the connectors, the two contact surfaces have the same or different designs.

4. The protection of an arrangement of space solar cells according to claim 1, wherein, for the connectors, the connecting piece between the two contact surfaces has a meandering design in order to mechanically decouple the two contact surfaces from one another.

5. The protection of an arrangement of space solar cells according to claim 1, wherein the two contact surfaces of the connectors each have a flat design, and each have a thickness between 0.01 mm and 0.7 mm in the Z direction.

6. The protection of an arrangement of space solar cells according to claim 1, wherein the connectors have a rectangular area, and a long side of the rectangular area has an extension that is larger than a short side by at least a factor of 5.

7. The protection of an arrangement of space solar cells according to claim 1, wherein all space solar cells of the string each have a bypass diode, and the bypass diode is directly connected to the particular space solar cell.

8. The protection of an arrangement of space solar cells according to claim 1, wherein one of the two contacted string protection diode arrangements is directly connected to the bypass diode of the space solar cell arranged at one of the two ends.

9. The protection of an arrangement of space solar cells according to claim 1, wherein the protection arrangement is provided at both ends of the string.

10. The protection of an arrangement of space solar cells according to claim 1, wherein, when light strikes the front side of the space solar cells, a current flows exclusively through the respective contacted string protection diode and the metal strip to a connection line.

11. The protection of an arrangement of space solar cells according to claim 1, wherein the cover of the DIE is transparent in the infrared range in order to reflect the solar radiation, and/or the cover is designed as a cover glass.

12. The protection of an arrangement of space solar cells according to claim 1, wherein the protection arrangement is provided directly at one of the two ends, and the distance in the X direction between the protection arrangement and the space solar cell that is connected to the protection arrangement is in a range between 10 μm and 10 mm or in a range between 100 μm and 2 mm.

13. The protection of an arrangement of space solar cells according to claim 1, wherein cooling for the string protection diodes is provided by the metal strip and/or a metal-plated bottom side of the DIEs.

14. The protection of an arrangement of space solar cells according to claim 1, wherein, for the connectors, at least one of the two contact surfaces or both contact surfaces has/have a contact tab or multiple contact tabs, respectively.

15. The protection of an arrangement of space solar cells according to claim 14, wherein the contact tabs have a thickness between 0.01 mm and 0.5 mm or between 0.02 mm and 0.2 mm.

* * * * *